United States Patent [19]

Haruki et al.

[11] Patent Number: 5,010,384

[45] Date of Patent: Apr. 23, 1991

[54] GATE TURN-OFF THYRISTOR WITH RESISTANCE LAYERS

[75] Inventors: Hiromu Haruki; Fumiaki Kirihata; Osamu Hashimoto, all of Kawasaki, Japan

[73] Assignee: Fuji Electric Co., Ltd., Kawasaki, Japan

[21] Appl. No.: 383,263

[22] Filed: Jul. 20, 1989

Related U.S. Application Data

[63] Continuation of Ser. No. 147,738, Jan. 25, 1988, abandoned.

[30] Foreign Application Priority Data

Jan. 29, 1987 [JP] Japan ............................ 62-018963
Aug. 6, 1987 [JP] Japan ............................ 62-196911

[51] Int. Cl.$^5$ ................ H01L 29/74; H01L 27/02; H01L 29/06; H01L 29/52
[52] U.S. Cl. .......................... 357/38; 357/51; 357/56; 357/68; 357/37
[58] Field of Search ............ 357/51, 36, 38, 56, 357/68, 37; 375/36, 38, 51, 56, 58

[56] References Cited

U.S. PATENT DOCUMENTS

| 4,127,863 | 8/1978 | Kurata | 357/38 |
| 4,411,708 | 10/1983 | Winhan | 148/1.5 |
| 4,516,149 | 5/1985 | Wakui et al. | 357/38 |
| 4,618,781 | 10/1986 | Silber et al. | 357/36 |
| 4,786,959 | 11/1988 | Shimizu et al. | 357/38 |

FOREIGN PATENT DOCUMENTS

| 0064613 | 11/1982 | European Pat. Off. . |
| 0220469 | 5/1987 | European Pat. Off. . |
| 3346833 | 7/1984 | Fed. Rep. of Germany . |
| 57-43462 | 3/1982 | Japan . |
| 2029096 | 3/1980 | United Kingdom . |

Primary Examiner—William Mintel
Assistant Examiner—Roy Potter
Attorney, Agent, or Firm—Spencer & Frank

[57] ABSTRACT

In a gate turn-off thyristor having a plurality of gate turn-off thyristor segments, each having a four-layer upon pnpn structure, a resistance layer is interposed between the emitter layer and the cathode electrode of each segment. A voltage drop occurs across the resistance layer and this voltage drop prevents a current concentration to a specific segment especially at the last stage of a turn-off process, so that the current flows in the respective remaining segments is improved. The voltage drop has a function of shunting the anode current so that the shunted current flows into the gate. Accordingly, the currents flowing through the respective segments and the turn-off times of the respective segments are intended to be made uniform. Therefore, the controllable on-state current can be considerably increased.

2 Claims, 3 Drawing Sheets

GATE TURN-OFF THYRISTOR WITH RESISTANCE LAYERS

This application is a continuation of application Ser. No. 07/147,738, filed 01/25/88, now abandoned.

BACKGROUND OF THE INVENTION

1. Field of the Invention

The present invention relates to a gate turn-off thyristor (referred to as a " GTO thyristor" hereinafter) which consists of a four-layer pnpn structure and which can be turned off by the current removed from a gate electrode disposed on one base layer.

2. Description of the Prior Art

FIG. 3 is a cross sectional view showing a portion of a conventional GTO thyristor (the portion being referred to as a "segment" hereinafter) which has a four-layer structure consisting of a p-type emitter layer 1, an n-type base layer 2, a p-type base layer 3 and an n-type emitter layer 4. A first main electrode, for example, an anode electrode 5 is applied to the p-type emitter layer 1. A gate electrode 6 is applied to the p-type base layer 3. A second electrode, for example, a cathode electrode 7 is applied to the n-type emitter layer 4. The n-type emitter layer 4 is in the form of a strip or rectangular island.

FIG. 4 is a plan view showing a GTO thyristor device having four segments, one of which is shown in FIG. 3, when viewed from the upper side of the cathode electrode 7. In this device, the anodes 5 of the four segments are connected in parallel and the cathodes 7 are also connected in parallel, while the gate electrodes 6 are connected in common. A controllable on-state current, that is, a turn-off current, which is one of important features of a GTO thyristor, is realized by removing a gate current from the gate electrode 6 arranged and connected in common.

In an actual GTO thyristor in which a plurality of segments are arranged in parallel with each other, the electrical characteristics of the respective segments, such as on-state voltages and gate impedance values, vary one from another, so that in the case of turning off the GTO thyristor device, the operations of removing the gate currents from the gate electrodes 6 of the respective segments are not uniform among the segments. At the last stage of the turning off operation of the GTO thyristor device, a specific segment, for example, a segment where an on-state voltage is low or a gate impedance is high, may experience a "turn-off-failure" due to the concentration of current to the specific segment. By the concentration of the current to the specific segment, an increase of the controllable on-state current of the GTO thyristor is prevented. In the case of the formation of each layer by a conventional diffusion process and a lifetime-killer injection process, there is a limited capability of making the electrical characteristics of all segments uniform, so that a remarkable increase of the controllable on-state current cannot be expected.

SUMMARY OF THE INVENTION

In view of the above, one of the objects of the present invention is to provide a GTO thyristor in which the concentration of a current to a specific segment is suppressed to a minimum when the thyristor is turned off, so that the controllable on-state current of the thyristor is greatly increased.

To accomplish the above and other objects, according to the present invention, a resistance layer is interposed between a rectangular emitter layer disposed adjacent to a base layer to which a gate electrode is applied and a main electrode connected to the emitter layer.

In a first aspect of the present invention, a gate turn-off thyristor comprises:

a first main electrode;

an emitter layer of a first conductivity type disposed on the first main electrode;

a first base layer of a second conductivity type disposed on the emitter layer;

a second base layer of the first conductivity type disposed on the first base layer;

a plurality of emitter layers of the second conductivity type disposed on the second base, each of the plurality of emitter layers being in the form of an island;

a gate electrode disposed on a portion of the second base layer other than portions thereof on which the plurality of emitter layers are disposed;

a plurality of resistance layers disposed on the plurality of emitter layers, respectively; and a plurality of second main electrodes disposed on the plurality of resistance layers, respectively.

In a second aspect of the present invention, a gate turn-off thyristor comprises:

a first main electrode;

an emitter layer of a first conductivity type disposed on the first main electrode;

a first base layer of a second conductivity type disposed on the emitter layer;

a second base layer of the first conductivity type disposed on the first base layer;

a plurality of emitter layers of the second conductivity type disposed on the second base, each of the plurality of emitter layers being in the form of an island;

a gate electrode disposed on a portion of the second base layer other than portions thereof on which the plurality of emitter layers are disposed;

a plurality of metal layers disposed on the plurality of emitter layers, respectively;

a plurality of resistance layers disposed on the plurality of metal layers, respectively; and a plurality of second main electrodes disposed on the plurality of resistance layers.

Here, a resistance of each of the plurality of resistance layers may be determined within the range from 15 $m\Omega \cdot mm^2$ to 500 $m\Omega \cdot mm^2$.

The resistance layer thus interposed between the emitter layer and the main electrode has a function of preventing the current concentration when the GTO thyristor is turned off and also has a further function of promoting recovery to an off-state of the junction between the emitter layer and the base layer to which the gate electrode is applied so that the controllable on-state current can be increased.

The above and other objects, effects, features and advantages of the present invention will become more apparent from the following description of preferred embodiments thereof taken in conjunction with the accompanying drawings.

DETAILED DESCRIPTION OF PREFERRED EMBODIMENTS

Figure 1:
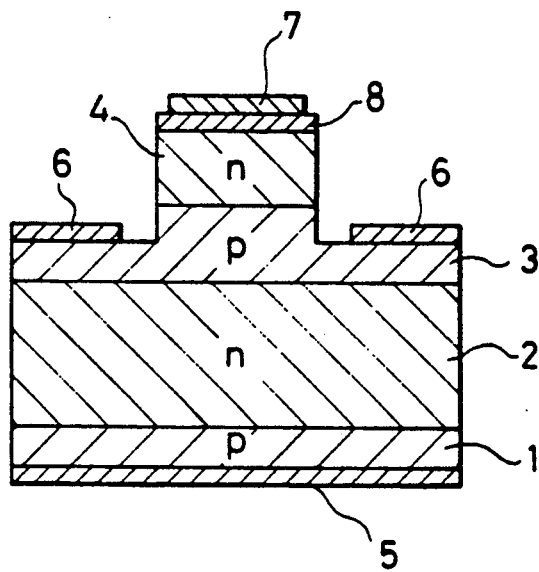
FIG. 1 is a sectional view showing the major parts of a first embodiment of the present invention.
Figure 2:
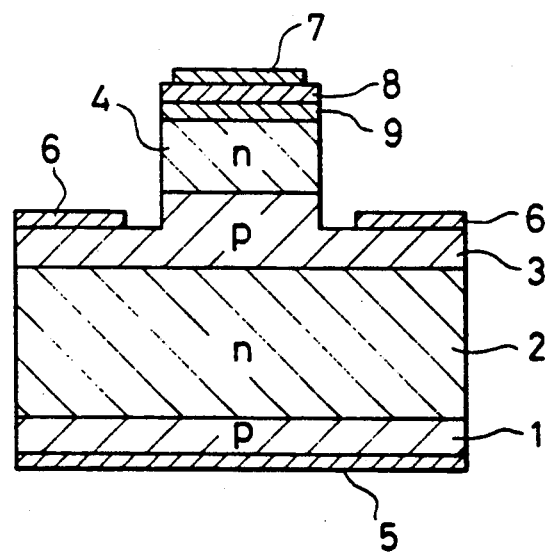
FIG. 2 is a sectional view showing the major parts of a second embodiment of the present invention.
Figure 3:
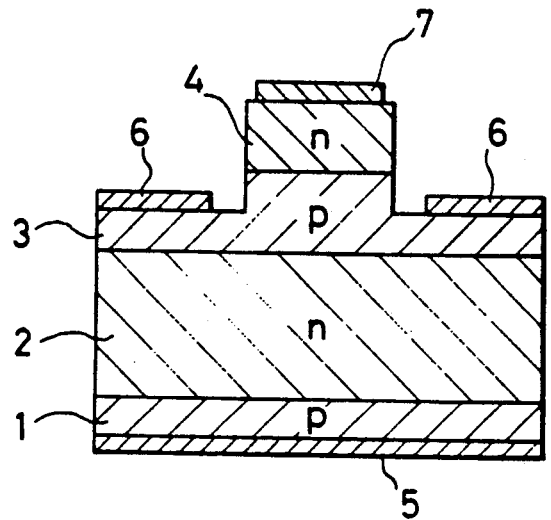
FIG. 3 is a sectional view showing the major parts of one example of a segment of a conventional GTO thyristor device.
Figure 4:
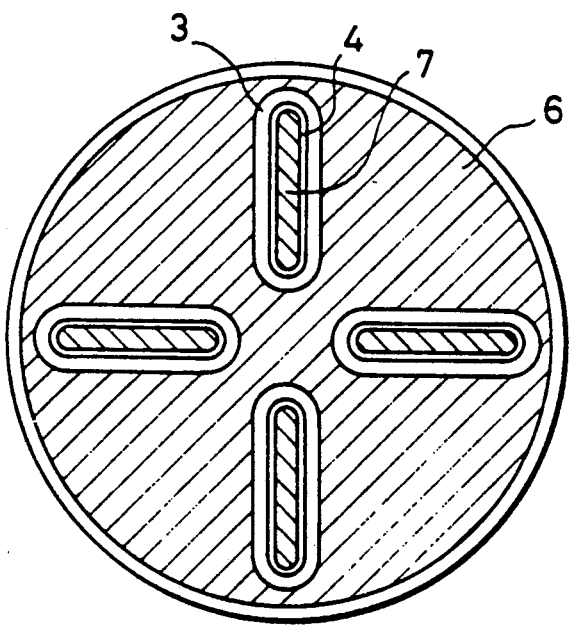
FIG. 4 is a plan view showing a GTO thyristor device including a plurality of segments.

FIGS. 1 and 2 show two embodiments of the present invention, respectively. Here, the same reference numerals are used to designate similar parts corresponding to those in FIGS. 3 and 4.

In the case of the first embodiment shown in FIG. 1, a resistance layer 8 consisting of, for instance, polycrystal silicon, is applied to the upper surface of the strip shaped or island-like n-type emitter layer 4 in each of a plurality of segments. The cathode electrode 7 is arranged on the upper surface of the resistance layer 8.

In the second embodiment of the present invention shown in FIG. 2, the resistance layer 8 is not disposed directly on the upper surface of the n-type emitter layer 4, but is interposed between a metal layer 9 applied to the upper surface of the n-type emitter layer 4, and the lower surface of the cathode electrode 7. This structure increases the freedom of selecting a material of the resistance layer 8 from a variety of materials.

When the resistance layer 7 is interposed between the n-type emitter layer 4 and the cathode electrode 7 in one segment, the controllable on-state current can be increased considerably.

Figure 5:
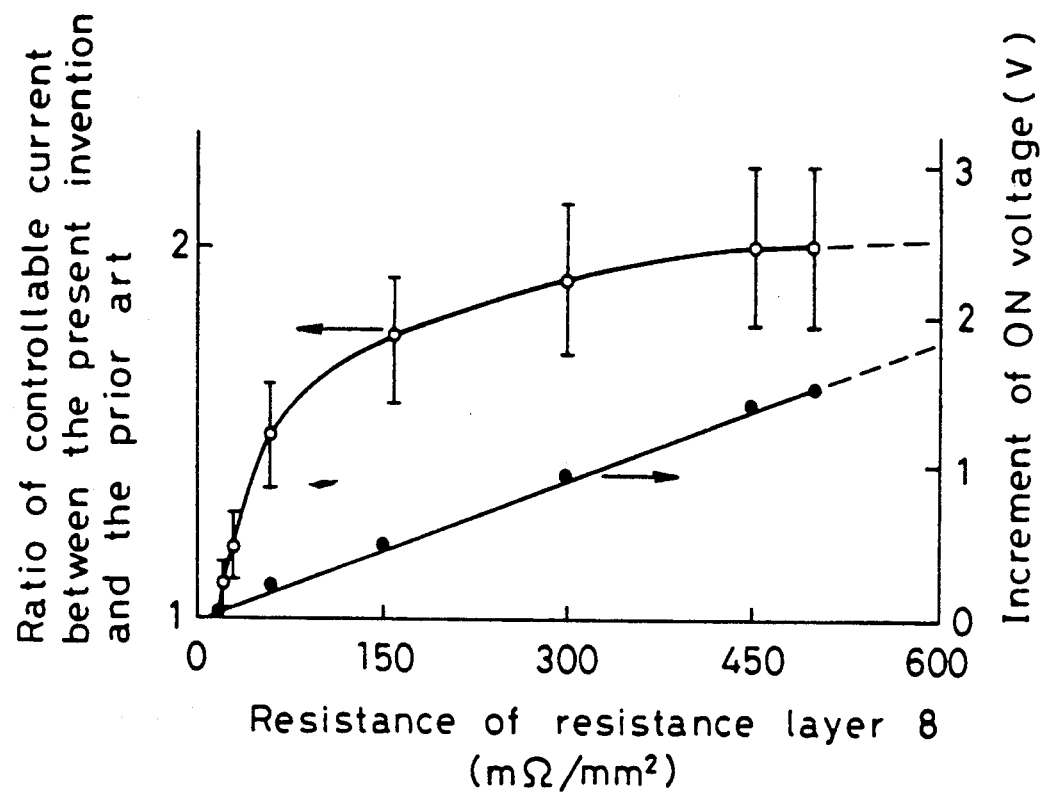
FIG. 5 is a graph illustrating the relationship between a ratio of a controllable on-state current of the present invention and that of a device, prior art versus an on-state voltage with a resistance due to a resistance layer.

FIG. 5 shows the relationship of a ratio of a controllable on-state current between the present invention and the prior art and an on-state voltage with a resistance of the resistance layer 8. When the resistance of the resistance layer 8 on the n-type emitter 4 is selected to be 15 $m\Omega \cdot mm^2$ or more, a significant increase in the controllable current can be observed. On the other hand, the on-state voltage is also increased in accordance with the increase of the resistance of the resistance layer 8, and when the resistance exceeds 500 $m\Omega \cdot mm^2$, the on-state voltage is increased to exceed 1.5 V. As a result, the on-state power dissipation of the device is increased due to the current flowing through the device and therefore a heat sink structure for the GTO thyristor becomes expensive from the viewpoint of the production cost.

Therefore, according to the present invention, in order to effectively improve the controllable on-state current without causing a significant increase of the on-state voltage by the resistance layer 8, it is preferable that the resistance of the resistance layer 8 is selected such that its resistance is within a range from 15 $m\Omega \cdot mm^2$ to 500 $m\Omega \cdot mm^2$.

According to the present invention, the resistance layer is interposed between the rectangular or island like n-type emitter layer 4 and the main or cathode electrode 7. As a result, a voltage drops occurs across the resistance layer 8, and this voltage drop prevents current concentration to a specific segment especially at the last stage of a turn-off process, and accordingly the current flow through the respective remaining segments is improved. In addition, the voltage drop has a function of shunting the anode current so that the shunted current flows into the gate. As a consequence, the currents flowing through the respective segments and the turn-off times of the respective segments are intended to be made uniform. Therefore, it is considered that the controllable on-state current can be considerably increased. In particular, when the resistance of the resistance layer 8 exceeds 15 $m\Omega \cdot mm^2$, the abovedescribed effects are further enhanced, and the increase of the on-state voltage can be controlled within a suitable range by selecting the resistance of the resistance layer 8 such that it does not exceed 500 $m\Omega \cdot mm^2$.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed:

1. A gate turn-off thyristor comprising:
   a first main electrode;
   an emitter layer of a first conductivity type disposed on said first main electrode;
   a first base layer of a second conductivity type disposed on said emitter layer;
   a second base layer of the first conductivity type disposed on said first base layer, said second base layer having a plurality of protrusions;
   a plurality of emitter layers of the second conductivity type disposed on respective ones of said plurality of protrusions of said second base layer, each of said plurality of emitter layers being in the form of a protruded island;
   a gate electrode disposed on a portion of said second base layer other than said protrusions on which said plurality of emitter layers are disposed;
   a plurality of resistance layers disposed on said plurality of emitter layers, respectively, and
   a plurality of second main electrodes disposed on said plurality of resistance layers, respectively;
   wherein each respective one of said plurality of resistance layers, in the respective direction of the thickness of each of said plurality of resistance layers, has a resistance within a range from 15 to 500 $m\Omega \cdot mm^2$.

2. A gate turn-off thristor, comprising:
   a first main electrode;
   an emitter layer of a first conductivity type disposed on said first main electrode;
   a first base layer of a second conductivity type disposed on said emitter layer;
   a second base layer of the first conductivity type disposed on said first base layer, said second base layer having a plurality of protrusions;
   a plurality of emitter layers of the second conductivity type disposed on respective ones of said plurality of protrusions of said second base layer, each of said plurality of emitter layers being in the form of a protruded island;
   a gate electrode disposed on a portion of said second base layer other than said protrusions on which said plurality of emitter layers are disposed;
   a plurality of metal layers disposed on said plurality of emitter layers, respectively;
   a plurality of resistance layers disposed on said plurality of metal layers, respectively; and
   a plurality of second main electrodes disposed on said plurality of resistance layers;
   wherein each respective one of said plurality of resistance layers, in the respective direction of the thickness of each of said plurality of resistance layers, has a resistance within a range from 15 to 500 $m\Omega \cdot mm^2$.

* * * * *